United States Patent
Tokiwa et al.

(10) Patent No.: US 7,986,557 B2
(45) Date of Patent: Jul. 26, 2011

(54) NONVOLATILE SEMICONDUCTOR MEMORY DEVICE AND NONVOLATILE SEMICONDUCTOR MEMORY SYSTEM

(75) Inventors: Naoya Tokiwa, Fujisawa (JP); Shigeo Ohshima, San Jose, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 176 days.

(21) Appl. No.: 12/533,529

(22) Filed: Jul. 31, 2009

(65) Prior Publication Data

US 2010/0027341 A1 Feb. 4, 2010

(30) Foreign Application Priority Data

Aug. 1, 2008 (JP) ................................. 2008-199707

(51) Int. Cl.
*G11C 16/04* (2006.01)
*G11C 5/14* (2006.01)
(52) U.S. Cl. .................................. 365/185.17; 365/226
(58) Field of Classification Search ............. 365/185.17, 365/185.23, 226
See application file for complete search history.

(56) References Cited

U.S. PATENT DOCUMENTS

| 5,663,918 | A | | 9/1997 | Javanifard et al. |
| 6,160,440 | A | * | 12/2000 | Javanifard et al. ............ 327/536 |
| 6,370,075 | B1 | * | 4/2002 | Haeberli et al. .............. 365/226 |
| 6,977,842 | B2 | * | 12/2005 | Nazarian .................. 365/185.18 |
| 2007/0040599 | A1 | | 2/2007 | Sato |
| 2009/0003103 | A1 | | 1/2009 | Shimizu et al. |

* cited by examiner

*Primary Examiner* — Anh Phung
(74) *Attorney, Agent, or Firm* — Oblon, Spivak, McClelland, Maier & Neustadt, L.L.P.

(57) ABSTRACT

A memory may include word lines; bit lines; cells provided corresponding to intersections between the word lines and the bit lines; sense amplifiers detecting data; a column decoder selecting a certain bit line for the sense amplifiers to output read data or receive write data; a row decoder configured to select a certain word line; a charge pump supplying power to the sense amplifiers, the column decoder, and the row decoder; a logic circuit controlling the sense amplifiers, the column decoder, and the row decoder based on an address selecting the memory cells; a first power source input applying a voltage to the logic circuit; and a second power source input applying a voltage higher than a voltage of the first power source input to the charge pump, and to supply power to the charge pump at least at a data reading time and a data writing time.

14 Claims, 7 Drawing Sheets

NONVOLATILE SEMICONDUCTOR MEMORY DEVICE AND NONVOLATILE SEMICONDUCTOR MEMORY SYSTEM

CROSS-REFERENCE TO RELATED APPLICATION

This application is based upon and claims the benefit of priority from the prior Japanese Patent Applications No. 2008-199707, filed on Aug. 1, 2008, the entire contents of which are incorporated herein by reference.

BACKGROUND OF THE INVENTION

1. Field of the Invention

The present invention relates to a nonvolatile semiconductor memory device and a nonvolatile semiconductor memory system.

2. Related Art

As one of nonvolatile semiconductor memory devices, NAND flash memory has been widely known. SSD (Solid State Drive) using plural NAND flash memories has been also widely known. The NAND flash memory (hereinafter, also "flash memory") and the SSD are designed to operate using a single-standard supply power source to enable application of these devices to various devices by simplifying system designs.

There are also flash memories capable of using power sources of plural different voltages. In this case, different power sources are used for each of an I/O circuit and other memory elements. That is, substantially, these flash memories are also designed to operate using a single power source.

For example, when a 5 V power source is used for a flash memory that conforms to a 3.3 V power source standard, the 5 V needs to be once stepped down to 3.3 V.

However, the flash memory requires a voltage equal to or above 3.3 V (20 V, for example) to write data and to erase data. At a data reading time, a voltage equal to or above the 3.3 V power source standard (6 V, for example) needs to be applied to an unselected word line. Considering a voltage drop in wiring, a higher voltage than this (9 V, for example) is actually necessary. In this case, a high voltage boosted from the regulated voltage is required in the flash memory.

When the stepped-down low voltage is boosted in this way, a step-up factor of a boosting circuit becomes large. This increases current consumption of the boosting circuit, and also increases time required to write data, erase data, and read data.

SUMMARY OF THE INVENTION

A nonvolatile semiconductor memory device according to an embodiment comprises: a plurality of word lines; a plurality of bit lines; a plurality of nonvolatile memory cells provided corresponding to intersections between the word lines and the bit lines, and configured to electrically store data; sense amplifiers configured to detect data of the memory cells, or to drive the bit lines in order to write data into the memory cells; a column decoder configured to select a certain bit line from the bit lines for the sense amplifiers to output read data or receive write data; a row decoder configured to select a certain word line from the word lines; a charge pump configured to supply power to the sense amplifiers, the column decoder, and the row decoder; a logic circuit configured to control the sense amplifiers, the column decoder, and the row decoder based on an address selecting the memory cells from which data is to be read or into which data is to be written; a first power source input configured to apply a voltage to the logic circuit; and a second power source input configured to apply a voltage higher than a voltage of the first power source input to the charge pump, and to supply power to the charge pump at least at a data reading time and a data writing time.

A nonvolatile semiconductor memory system according to an embodiment comprises: a plurality of the nonvolatile semiconductor memory devices according to claim 1; a power source connector configured to receive from the outside a voltage input to the second power source input of the nonvolatile semiconductor memory devices; a voltage step-down part configured to step down a voltage input to the second power source input and to generate a voltage to be input to the first power source input of the nonvolatile semiconductor memory devices; and a controller configured to operate by receiving the second power source input and to control the nonvolatile semiconductor memory devices.

DETAILED DESCRIPTION OF THE INVENTION

Embodiments of the present invention will be explained below in detail with reference to the accompanying drawings. Note that the invention is not limited thereto.

First Embodiment

Figure 1:
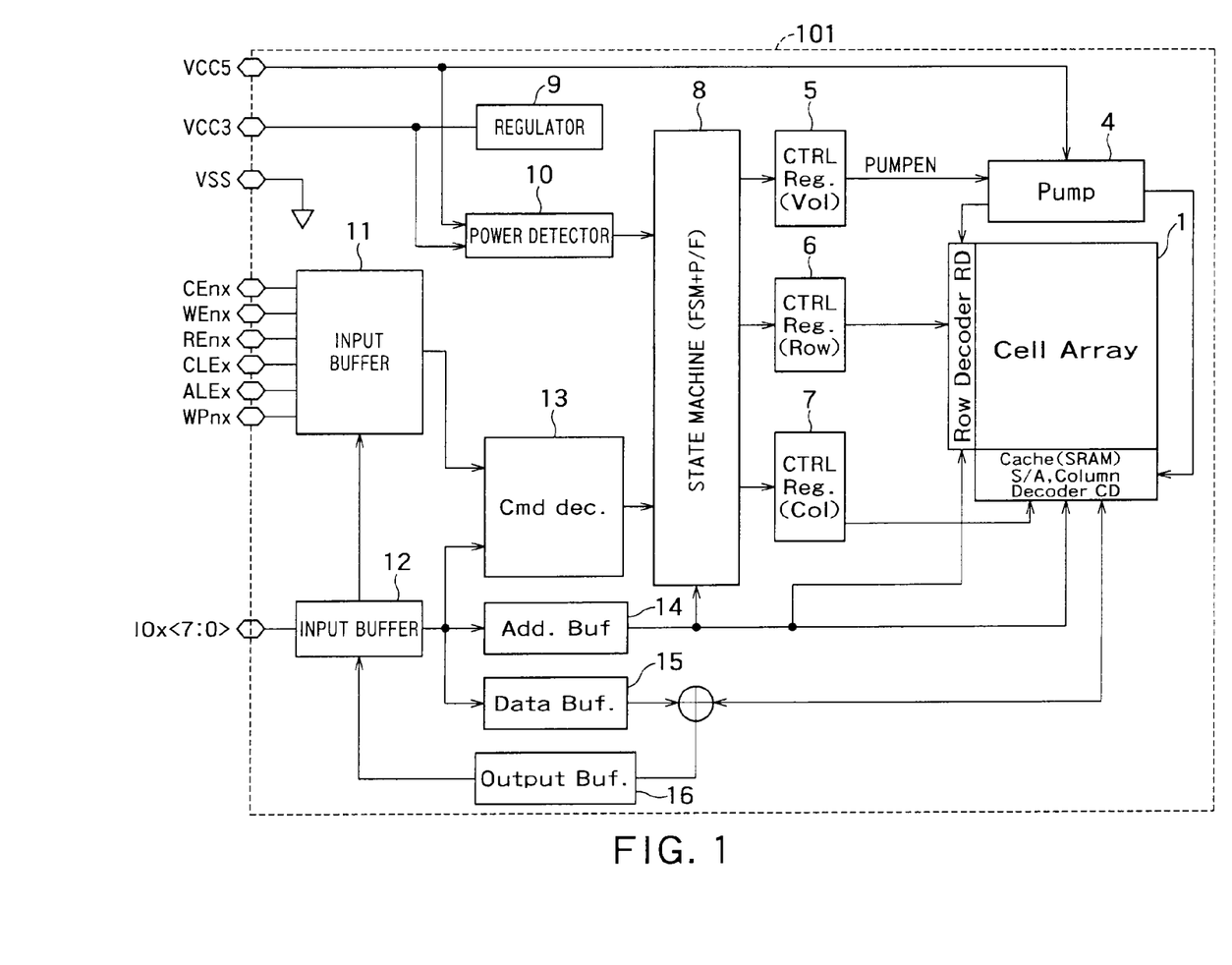
FIG. 1 is a block diagram showing a configuration of a NAND flash memory according to a first embodiment.
Figure 2:
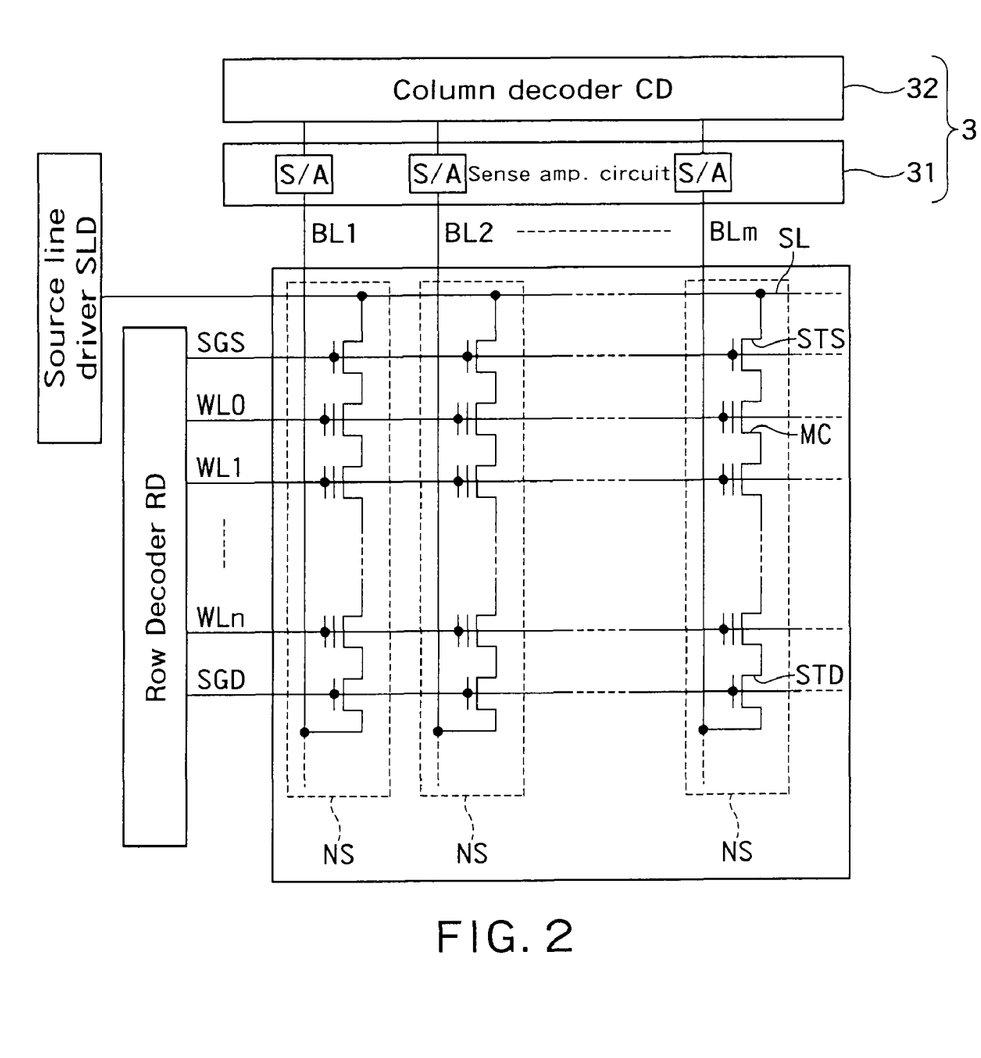
FIG. 2 shows an internal configuration of the memory cell array 1 and a configuration of peripheral units of the memory cell array 1.

FIG. 1 is a block diagram showing a configuration of a NAND flash memory according to a first embodiment of the present invention. A memory chip 101 includes a memory cell array 1. The memory cell array 1 is configured by having plural memory cells arranged two dimensionally as shown in FIG. 2. However, NAND strings, in each of which a plurality of the memory cells connected serially, may be arranged in a direction perpendicular to a surface of a semiconductor substrate. That is, NAND strings may extend in the direction perpendicular to the surface of the semiconductor substrate. In this case, the memory cell array 1 is configured by having plural memory cells arranged three dimensionally.

The memory cell array 1 is connected to plural bit lines BL and plural word lines WL. The plural bit lines BL are connected to sense amplifiers S/A, and the plural word lines WL are connected to a row decoder RD.

Each sense amplifier S/A drives a bit line to detect data from memory cells or write data into memory cells. Each sense amplifier S/A includes a latch circuit, and can temporarily hold read data or write data. The sense amplifiers S/A are connected to a column decoder CD.

A cache (SRAM) 3 is arranged to correspond to bit lines constituting a page, at one to one, for example, and holds write data and a result of writing. When data is written into a page, for example, data of an SRAM corresponding to this page is set to 1. When data is not written into a page, data of an SRAM corresponding to this page is set to 0.

The column decoder CD selects a certain bit line (a column) for a sense amplifier to output read data or to receive write data. More specifically, the column decoder CD decodes a column address, and reads data from the sense amplifier S/A or transmits data to the sense amplifier S/A following the decoded column address. Accordingly, the column decoder CD can read data stored in a latch circuit of a selected sense amplifier S/A or write data into this latch circuit.

The row decoder RD decodes a row address, and selectively inactivates the word line WL following the row address. In the NAND memory, the row decoder RD inactivates only a selected word line WL, and maintains other unselected word lines in an active state. Accordingly, in NAND strings NS shown in FIG. 2, data in a selected memory cell connected to the selected word line WL is transmitted to the bit line BL and the sense amplifiers S/A through other unselected memory cells. Alternatively, data held in the sense amplifier S/A is written into the selected memory cell connected to the selected word line WL via the bit line BL and other unselected memory cells.

A command, an address, and data are input to an input buffer 12. External control signals such as a chip enable signal CEnx, a write enable signal WEnx, and a read enable signal REnx are input to an input buffer 11. A command decoder 13 decodes these commands, and transmits the decoded commands to a state machine 8 as a logic control circuit. The state machine 8 controls operations of voltage application to memory cells and address control.

The state machine 8 controls a charge pump 4, the row decoder RD, and the column decoder CD via control registers 5 to 7, and determines a timing of voltage application and a timing of address transfer. More specifically, the state machine 8 receives an address to determine the selected memory cell from which data is to be read or into which data is to be written. Further, the state machine 8 drives the row decoder RD and the column decoder CD at a predetermined timing following a command decoded by the command decoder 13. The row decoder RD and the column decoder CD receive a row address and a column address from an address buffer 14, respectively, and drive the word line WL and the bit line BL by receiving control from the state machine 8.

Write data is loaded onto the sense amplifier S/A via a data buffer 15. Read data is output from the sense amplifier S/A to the outside via an output buffer 16.

The flash memory according to the first embodiment includes a control pin for inputting a command from the outside of the memory to the input buffer 11, an I/O pin for inputting an address from the outside of the memory to the input buffer 12, and a power source pin for receiving a first power source VCC3 and a second power source VCC5. Usually, a regulator circuit 9 generates an internal power source by stepping down the first power source VCC3 so as not to directly transmit the first power source VCC3 as an external supply power source into the device. The internal power source generated by the regulator circuit 9 is supplied to a peripheral logic control circuit including the state machine 8, the column decoder 13, the address buffer 14, the data buffer 15, the output buffer 16, the input buffers 11 and 12, and the control registers 5 to 7.

The first power source VCC3 is a power source based on a normal range (3.3±0.3 V) or a wide range (2.7 to 3.6 V) of a 3.3 V power-source voltage specification (ED-5001A) of the JEITA (Standard of Japan Electronics and Information Technology Industries Association), for example. Alternatively, the first power source VCC3 is a power source based on a normal range (1.8±0.15 V) or a wide range (1.2 to 1.95 V) of a 1.8 V power-source voltage specification (ED-5003A) of the JEITA, for example.

The second power source VCC5 is a 5V DC power source included in a Peripheral Power Connector described at page 20 of ATX Specification—Version 2.2 (hereinafter, ATX), for example. This power source can be applied to a hard disk drive (HDD) and the like.

A conventional memory is designed to operate using a single power source of the first power source VCC3. However, the flash memory according to the first embodiment includes a second power source input pin for receiving the second power source VCC5 in addition to a first power source input pin for receiving the first power source VCC3. The second power source VCC5 supplies power to the charge pump 4. The charge pump 4 boosts a voltage of the second power source VCC5 to generate a high voltage (9 V or 20 V, for example) necessary to read data, write data, and erase data. A high voltage obtained by the charge pump 4 is supplied to necessary positions including the row decoder RD or a substrate (well) of the cell array 1.

Because the voltage of the second power source VCC5 is higher than that of the first power source VCC3, the number of boosting stages constituting the charge pump 4 can be smaller than that of a conventional boosting stages.

A ground pin is maintained at a ground potential VSS common to the first power source VCC3 and the second power source VCC5. The ground pin can be divided to correspond to the first power source VCC3 and the second power source VCC5, respectively.

FIG. 2 shows an internal configuration of the memory cell array 1 and a configuration of peripheral units of the memory cell array 1. The memory cell array 1 includes plural NAND strings NS. Each NAND string NS includes plural memory cells MC connected in series. One end of the memory cells MC connected in series is connected to a bit line BLi (i is an integer) via a selected transistor STD, and the other end of the memory cells MC is connected to a common source line SL via a selected transistor STS. The source line SL is connected to a source line driver SLD.

Gates of the memory cells MC within each NAND string NS are connected to mutually different word lines WLj (j is an integer). In this way, the memory cells MC are provided corresponding to intersections between the word lines WLj and the bit lines BLi. Each memory cell MC is a nonvolatile memory cell electrically storing data.

Gates of the selected transistors STD and STS are connected to selected gates SGD and SGS, respectively. The selected transistors STD and STS selectively connect a certain NAND string NS between the bit line BL and the source line SL.

An aggregate of plural NAND strings NS arranged in a drawing direction of the word lines WL constitutes a block as a minimum unit of data erasing. Although not shown, plural blocks are arranged in a drawing direction of the bit lines BL.

As described above, the NAND memory inactivates only the selected word line WL, and maintains other unselected word lines in the active state. That is, in unselected memory cells, control gates are in the active state, and therefore, the unselected memory cells become in the on state. Accordingly, the selected memory cell is connected between the bit line BL and the source line SL via the unselected memory cells. In the selected memory cell, a control gate is inactive, and therefore, a conduction state (on or off) of the selected memory cell changes according to an accumulation state of charges within a floating gate.

At a reading time, the sense amplifier S/A compares a reference voltage with a voltage of the bit line BL according to a conduction state of the selected memory cell, and detects data stored in the selected memory cell.

At a writing time, the sense amplifier S/A applies a predetermined voltage to the selected memory cell, thereby accumulating charges into the floating gate or discharging charges from the floating gate. With this arrangement, data "0" or data "1" is written into the selected memory cell.

At a data erasing time, the same data is written into the total memory cells of the block.

Figure 3:
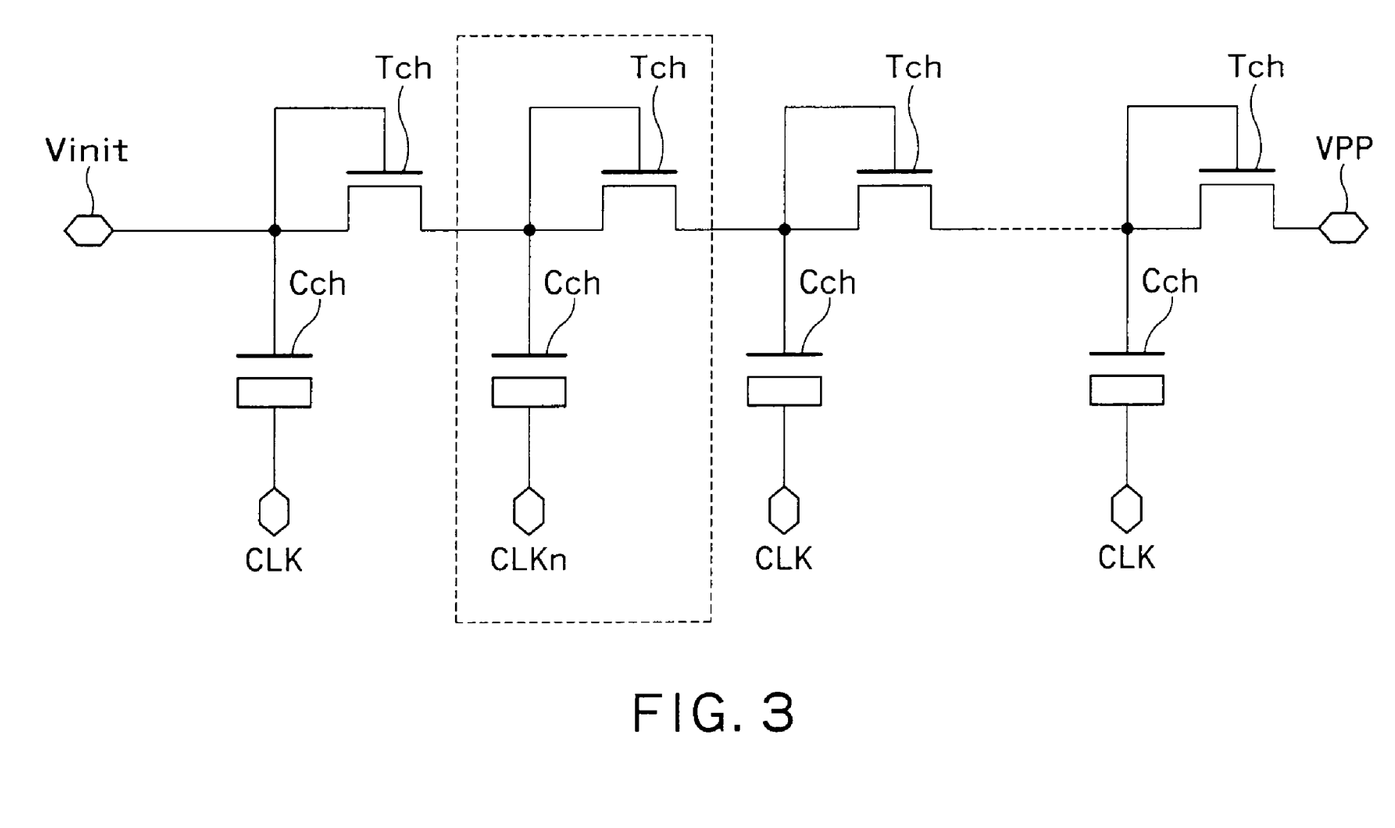
FIG. 3 is a circuit diagram showing one example of an internal configuration of the charge pump 4.

FIG. 3 is a circuit diagram showing one example of an internal configuration of the charge pump 4. The charge pump 4 includes plural transistors Tch connected in series with each other and connected in diode, capacitors Cch connected to one ends of the transistors Tchs, and clock signals CLK for driving the capacitors Cch. The clock signals CLK and CLKn in mutually reversed phases are input to two adjacent capacitors Cch. With this arrangement, the charge pump 4 transfers charges accumulated in the capacitors Cch, and boosts accumulated voltage of the charges. When one transistor Tch and one capacitor Cch form one boosting stage, a maximum voltage Vpp output from a final boosting stage depends on the number of boosting stages, an initial voltage Vinit, and charge transfer efficiency of a boosting circuit of the boosting stages. Although not shown, Vinit is a charge supply source generated based on the second power source VCC5 in the first embodiment.

Figure 4:
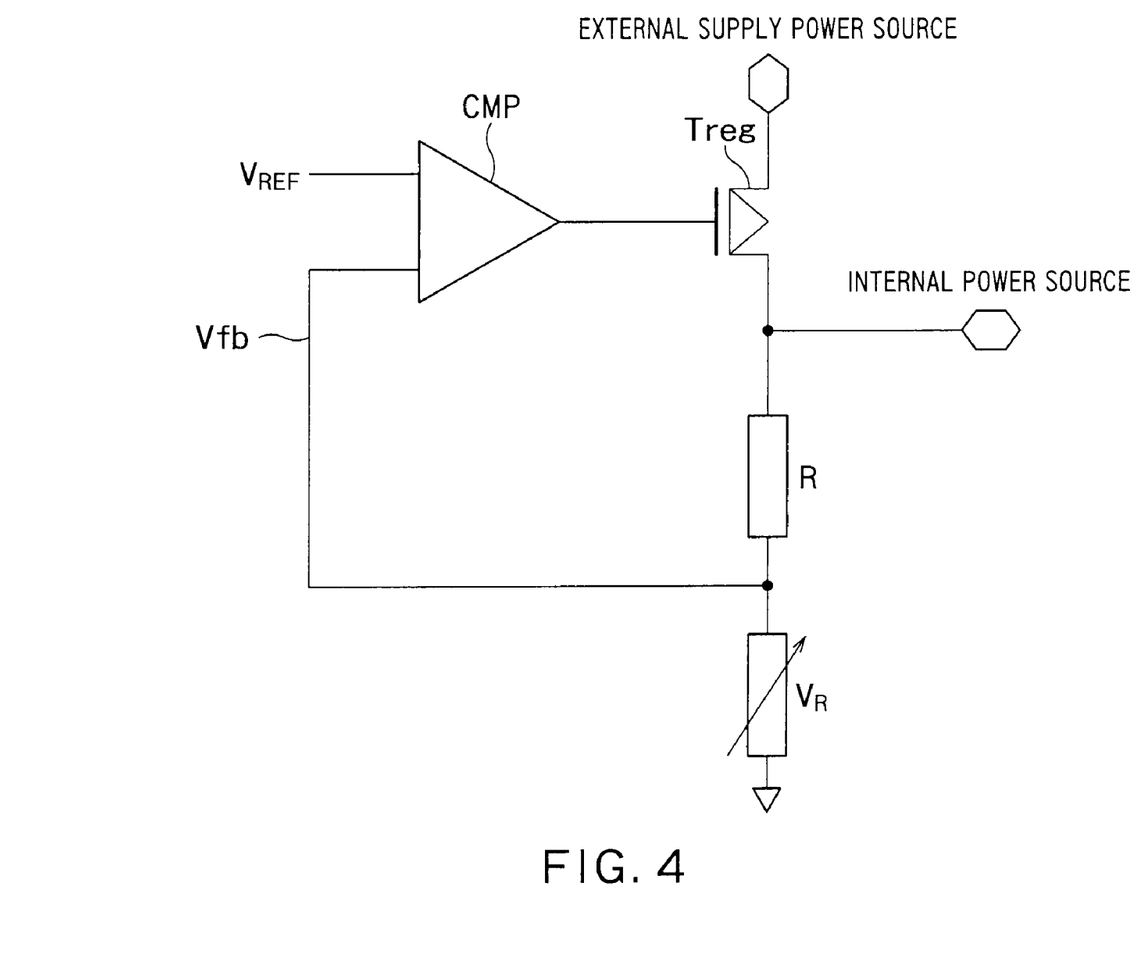
FIG. 4 is a circuit diagram showing one example of an internal configuration of the regulator circuit 9.

FIG. 4 is a circuit diagram showing one example of an internal configuration of the regulator circuit 9. The regulator circuit 9 supplies the first power source VCC3 as the external supply power source. The regulator circuit 9 includes a comparator CMP that functions to match a feedback voltage Vfb with a reference potential VREF generated inside the device, a transistor Treg controlled by an output of the comparator CMP and connected between the external supply power source and an internal power source, and resistors R and VR connected between the internal power source and a ground and generating the feedback voltage Vfb by dividing an internal power source voltage. The regulator circuit 9 can adjust the internal power source voltage by a variable resistor Vr. When the internal power source voltage steps down due to a current consumption by a circuit connected to the internal power source, the feedback voltage Vfb also steps down accordingly. Consequently, the output of the comparator CMP decreases, and the transistor Treg is turned on. As a result, the external supply power source increases the internal power source voltage, thereby compensating for the stepped down voltage.

Based on the above configuration, the regulator circuit 9 can stabilize the first power source VCC3, and can step down the voltage of the first power source VCC3 to a desired internal power source voltage. When a logic control circuit such as the state machine 8 includes synchronization circuits, a clock signal needs to be generated. The regulator circuit 9 is also used as a power source of a clock generating circuit for generating a clock signal. When a clock frequency is high, a large amount of current is consumed in average. Therefore, in this case, the amount of current supplied from the first power source VCC3 to the flash memory increases.

Figure 5:
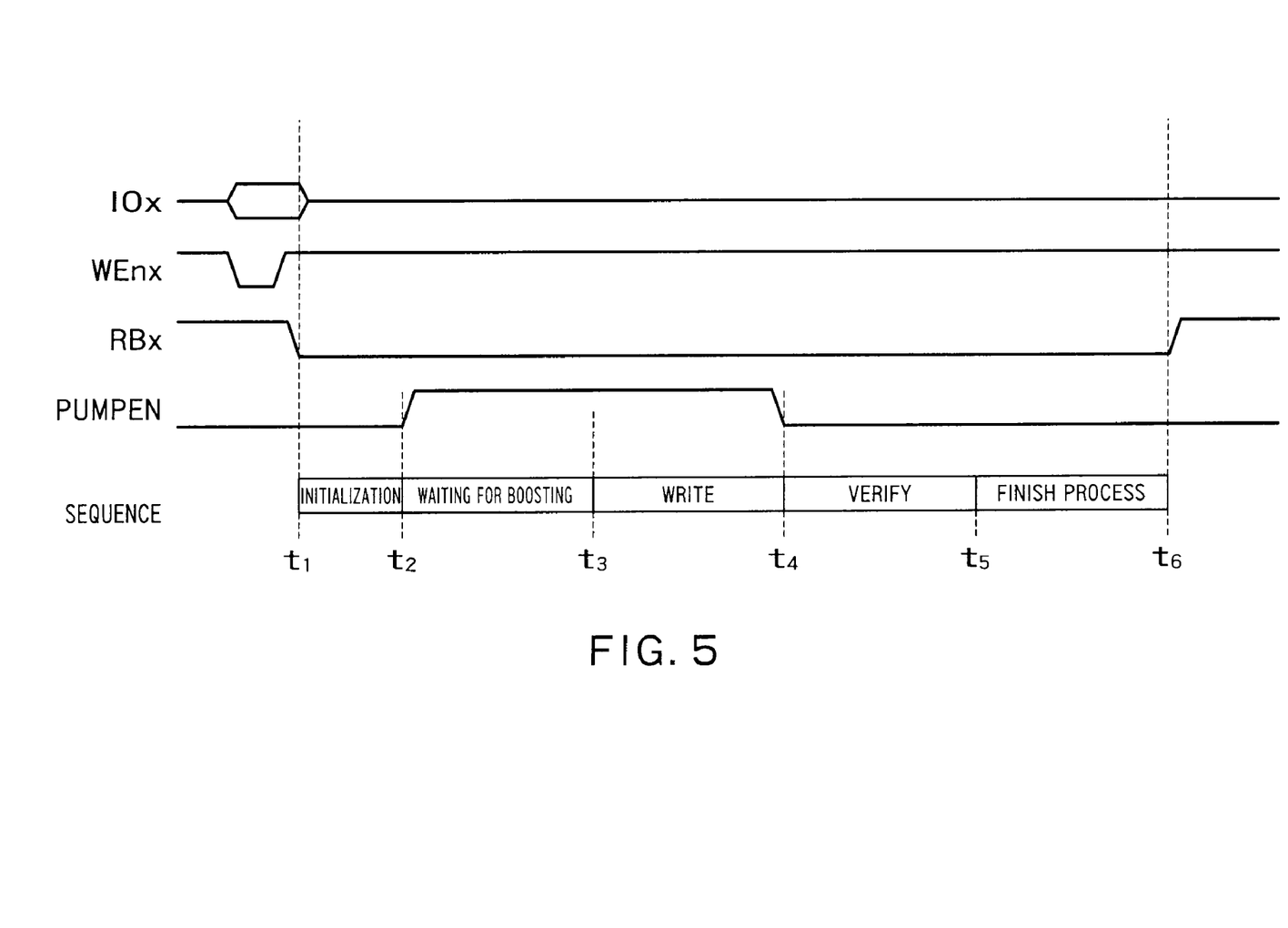
FIG. 5 is a timing diagram showing the operation of the flash memory.
Figure 6:
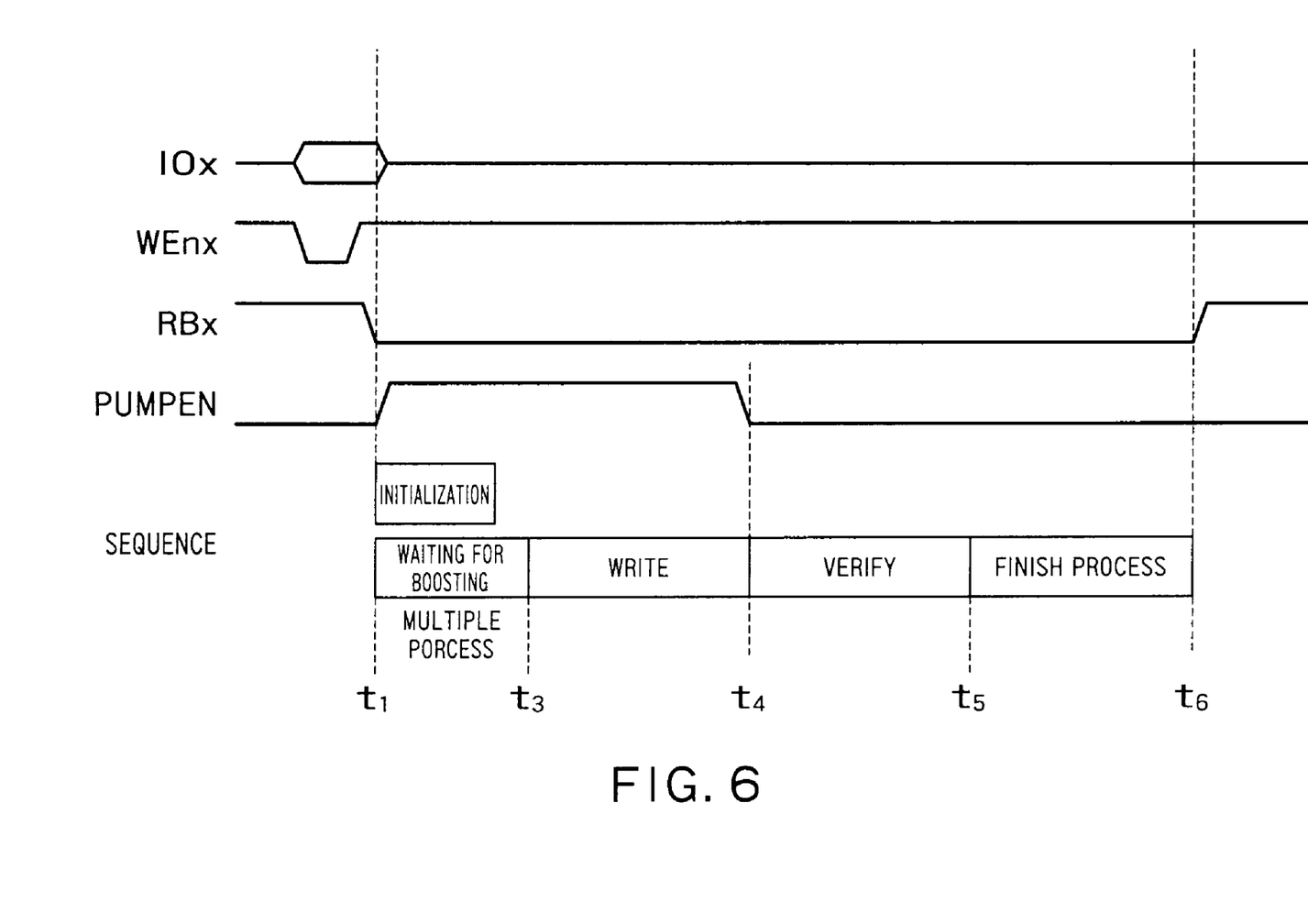
FIG. 6 is a timing diagram showing the operation of the flash memory.

FIG. 5 and FIG. 6 are timing diagrams showing the operations of the flash memory. The input buffer 12 receives a predetermined code of IOx. In this case, when a write enable signal WEnx received by the input buffer 11 is activated to a logic low, the flash memory 101 enters a data write state, and notifies to the outside that the flash memory 101 is in a busy state.

The state machine 8 controls each configuration element to perform the write operation. For example, the charge pump 4 receives a boost permission signal PUMPEN from the state machine 8. This boost permission signal PUMPEN is maintained in an active state during a period of waiting for a boosting of a power source voltage and during a write period.

According to the conventional flash memory, the first power source voltage VCC3 was used for the power source voltage of charge pump. Therefore, a charge supply source voltage (the first power source VCC3) supplied to the high voltage generate circuit to boost up a predefined high voltage is slightly low, a waiting time (t2 to t3) boosting up its voltage was long. Alternatively, the number of charge pump stages necessary to boost the voltage was constrained by an area occupied by a nonvolatile semiconductor device, and the necessary number of charge pump stages could not be mounted. Accordingly, the power-source boost waiting time was long.

In this flash memory according to the first embodiment, the second power source VCC5 that is higher than the first power source VCC3 is used for the source of a high voltage generator circuit. Therefore, the power-source boost waiting time (t2 to t3) can be shortened than a conventional waiting time. Further, the number of boosting stages of the charge pumps 4 can be smaller than that of a conventional boosting stages.

After writing data into a selected memory cell, the flash memory performs a verification of the write data at t4 to t5, and performs a finish process at t5 to t6, thereby finishing a series of data write operations. After finishing the operation, the flash memory 101 enters a precharge state.

FIG. 6 shows another operation of the flash memory according to the first embodiment. In the operation shown in FIG. 6, at t1 to t3, the flash memory simultaneously performs an initialization process and a power-source boost operation. The initialization process includes initialization of the control registers 5 to 7 and initialization of the cache (SRAM) 3 that temporarily stores data. When a power source shuts down during a last write operation, for example, the last write data remains in the control registers 5 to 7 in some cases. To erase this data, the flash memory initializes the control registers 5 to 7 prior to the receiving of the write data. In the case of a known nonvolatile semiconductor memory device, the cache (SRAM) 3 simultaneously initializes the number of bits obtained by multiplying eight to the number of bytes of a page. Accordingly, a large amount of current is necessary during a short period in some cases.

When a logic circuit including the cache (SRAM) 3 consumes current in the initialization process, there is concern in the conventional flash memory that a power source voltage of the first power source VCC3 drops and that an effective power source voltage decreases due to a wiring resistance inside the nonvolatile semiconductor memory device. Therefore, the conventional flash memory cannot perform the boost operation in the charge pump circuit at the initialization stage.

On the other hand, in the first embodiment, the charge pump 4 receives a power supply from the second power source VCC5 different from the first power source VCC3 that supplies power to the logic circuit. Therefore, the flash memory can simultaneously perform (multiple process) the initialization process and the power-source boost operation.

Accordingly, in the first embodiment, a period from an input of an operation command to a start of a data write operation (t1 to t3) is very short.

That is, in the write operation shown in FIG. 6, because the second power source VCC5 having a higher voltage than that of the first power source VCC3 is used for a boost operation, the charge pump 4 can quickly boost the power source voltage to a predetermined voltage. Further, because the flash memory can simultaneously perform the initialization process and the power-source boost operation, the flash memory can further shorten the total time of the data write operation.

Further, in the first embodiment, the second power source VCC5 is wired independently of the first power source VCC3. That is, the charge pump 4 and the logic circuit receive power in an electrically isolated state. Therefore, noise generated in the charge pump 4 does not easily affect the logic circuit side.

The flash memory according to the first embodiment can include a third power source that supplies power to the control pin and the I/O pin connected to the input buffers 11 and 12. In this case, a potential of the third power source is set different from potentials of the first and second power sources. A potential of the third power source is optional, and is usually lower than a potential of the first power source VCC3.

While the data write operations are shown in FIGS. 5 and 6, similar effects can be obtained in the data read operation.

Second Embodiment

Figure 7:
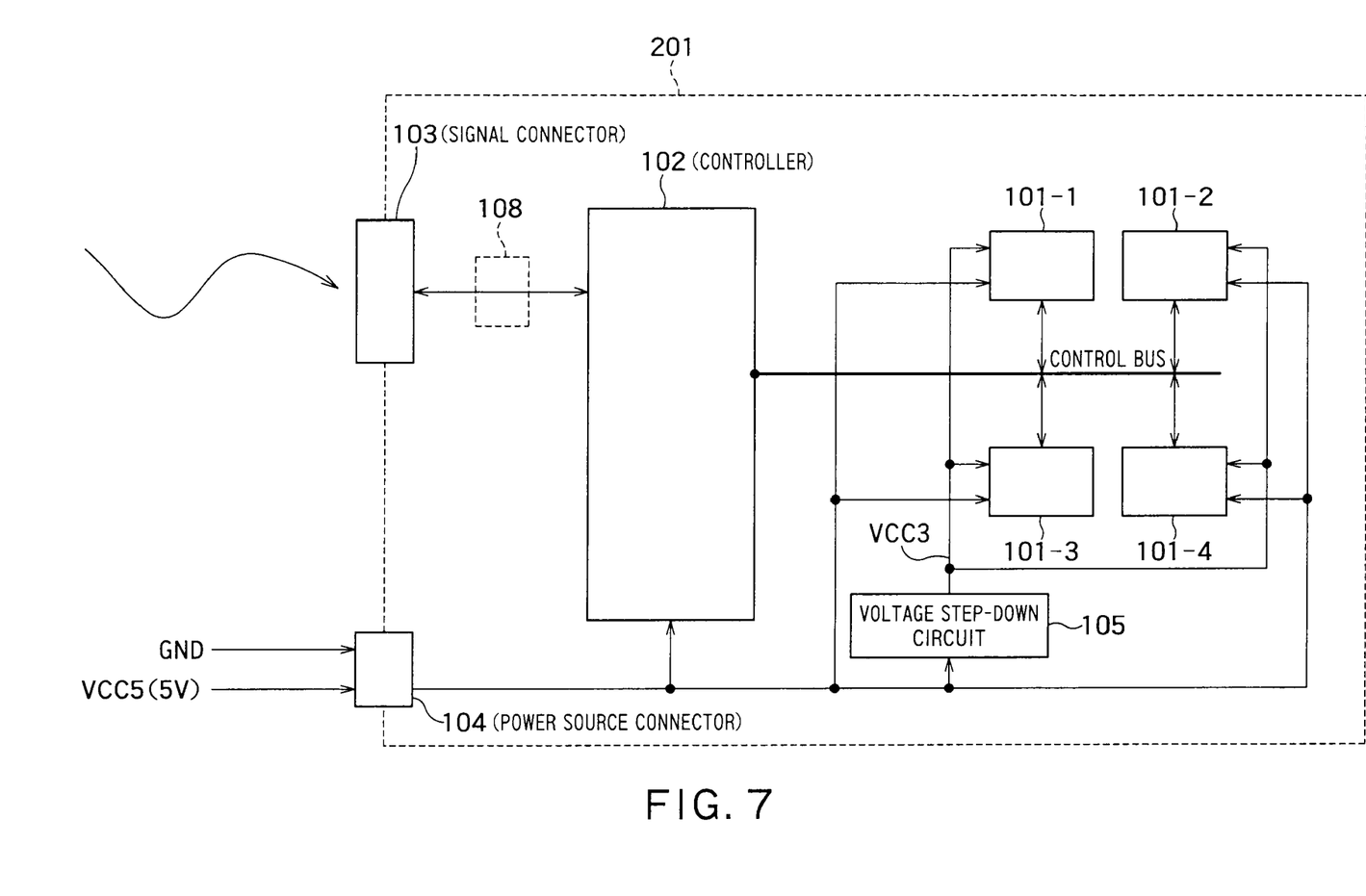
FIG. 7 is a block diagram showing a configuration of a memory system according to a second embodiment.

FIG. 7 is a block diagram showing a configuration of a memory system according to a second embodiment of the present invention. This memory system 201 is mounted with plural flash memories 101-1 to 101-4. In FIG. 7, while four memory chips are mounted, five or more memory chips or three or smaller number of memory chips can be mounted. Each of the flash memories 101-1 to 101-4 has a configuration similar to that of the flash memory 101 shown in FIG. 1.

A control device 102 is connected to the flash memories 101-1 to 101-4 via a control bus. The control device 102 is also connected to a signal connector 103, receives a command, an address, and data from the outside of the system, and outputs data to the outside of the system 201. The control device 102 temporarily stores data and the like when necessary. The signal connector 103 is a SATA (Serial ATA) or the like although not particularly limited.

A power source connector 104 is connected to the control device 102, a voltage step-down circuit 105, and the flash memories 101-1 to 101-4. The power source connector 104 receives the second power source VCC5 (5 V, for example) supplied from the outside of the system 201, and supplies power of the second power source VCC5 to the control device 102, the voltage step-down circuit 105, and the flash memories 101-1 to 101-4. The voltage step-down circuit 105 steps down the voltage of the second power source VCC5, and generates the first power source VCC3. The voltage step-down circuit 105 supplies power of the first power source VCC3 to the flash memories 101-1 to 101-4. As explained above, the memory system 201 according to the second embodiment generates the first power source VCC3 from a single power source (VCC5) by using the voltage step-down circuit 105, and supplies the first power source VCC3 to the flash memories 101-1 to 101-4. The second power source VCC5 is directly supplied to the control device 102 and the flash memories 101-1 to 101-4.

With the above arrangement, while the system receives only supply of the second power source VCC5, a nonvolatile semiconductor memory system including the flash memories 101-1 to 101-4 according to the first embodiment can be configured. In the second embodiment, the same effects as those of the first embodiment can be achieved without losing the convenience of the first embodiment.

In the second embodiment, a voltage converter circuit 108 can be provided between the signal connector 103 and the control device 102. In FIG. 7, the voltage converter circuit 108 is shown by a broken line. The voltage converter circuit 108 functions as a signal level converter circuit at the time of being connected with a signal of a different voltage standard.

In the second embodiment, only one voltage step-down circuit 105 can be provided for the flash memories 101-1 to 101-4, or one voltage step-down circuit 105 can be provided for each of the flash memories 101-1 to 101-4 according to supply capacity.

According to the second embodiment, the speed of the total memory system can be increased. When one voltage step-down circuit 105 is provided for each of the flash memories 101-1 to 101-4, efficiency of the voltage step-down circuit 105 in the total system is improved.

In the above embodiments, activation means to turn on or drive an element or a circuit, and inactivation means to turn off or suspend an element or a circuit. Therefore, it should be noted that a signal of HIGH (a high potential level) can be an activation signal, and a signal of LOW (a low potential level) can be an activation signal. For example, an NMOS transistor is activated by setting a gate to HIGH. On the other hand, a PMOS transistor is activated by setting a gate to LOW.

The invention claimed is:

1. A nonvolatile semiconductor memory device comprising:
   a plurality of word lines;
   a plurality of bit lines;
   a plurality of nonvolatile memory cells provided corresponding to intersections between the word lines and the bit lines, and configured to electrically store data;
   sense amplifiers configured to detect data of the memory cells, or to drive the bit lines in order to write data into the memory cells;
   a column decoder configured to select a certain bit line from the bit lines for the sense amplifiers to output read data or receive write data;
   a row decoder configured to select a certain word line from the word lines;
   a charge pump configured to supply power to the sense amplifiers, the column decoder, and the row decoder;
   a logic circuit configured to control the sense amplifiers, the column decoder, and the row decoder based on an address selecting the memory cells from which data is to be read or into which data is to be written;
   a first power source input configured to apply a voltage to the logic circuit; and
   a second power source input configured to apply a voltage higher than a voltage of the first power source input to the charge pump, and to supply power to the charge pump at least at a data reading time and a data writing time.

2. The device of claim 1, wherein
   the first power source input receives a power supply from a power source pursuant to a normal range (3.3±0.3 V) or a wide range (2.7 to 3.6 V) of a 3.3 V power-source voltage specification (ED-5001A) of the JEITA, and
   the second power source input receives a power supply from a power source pursuant to a 5 V power-source voltage specification of ATX.

3. The device of claim 1, wherein
   the first power source input receives a power supply from a power source pursuant to a normal range (1.8±0.15 V) or a wide range (1.2 to 1.95 V) of a 1.8 V power-source voltage specification (ED-5003A) of the JEITA, and the second power source input receives a power supply from a power source pursuant to a 5 V power-source voltage specification of ATX.

4. The device of claim 1, wherein the second power source input receives a power supply from a power source of which voltage is the same as that of a power source for a hard disk drive (HDD).

5. The device of claim 2, wherein the second power source input receives a power supply from a power source of which voltage is the same as that of a power source for a hard disk drive (HDD).

6. The device of claim 3, wherein the second power source input receives a power supply from a power source of which voltage is the same as that of a power source for a hard disk drive (HDD).

7. The device of claim 1, further comprising a cache configured to store information of the memory cells into which data is to be written or from which data is to be read, wherein in a data write operation or a data read operation, the nonvolatile semiconductor memory device simultaneously performs both an initialization operation of storing into the cache the information of the memory cells into which data is to be written or from which data is to be read and a boost operation of the second power source input by the charge pump.

8. The device of claim 2, further comprising a cache configured to store information of the memory cells into which data is to be written or from which data is to be read, wherein in a data write operation or a data read operation, the nonvolatile semiconductor memory device simultaneously performs both an initialization operation of storing into the cache the information of the memory cells into which data is to be written or from which data is to be read and a boost operation of the second power source input by the charge pump.

9. The device of claim 3, further comprising a cache configured to store information of the memory cells into which data is to be written or from which data is to be read, wherein in a data write operation or a data read operation, the nonvolatile semiconductor memory device simultaneously performs both an initialization operation of storing into the cache the information of the memory cells into which data is to be written or from which data is to be read and a boost operation of the second power source input by the charge pump.

10. The device of claim 4, further comprising a cache configured to store information of the memory cells into which data is to be written or from which data is to be read, wherein in a data write operation or a data read operation, the nonvolatile semiconductor memory device simultaneously performs both an initialization operation of storing into the cache the information of the memory cells into which data is to be written or from which data is to be read and a boost operation of the second power source input by the charge pump.

11. The device of claim 1, wherein the logic circuit and the charge pump respectively receive a power supply from the first power source input and the second power source input in an electrically isolated state.

12. The device of claim 1, further comprising:
a buffer configured to store a command or an address from the outside; and
a third power source input configured to supply power to the buffer, having a voltage lower than a voltage of the first power source input.

13. The device of claim 1, wherein a plurality of the memory cells connected serially to from NAND strings, and
the NAND strings extend in a direction perpendicular to a surface of a semiconductor substrate of the device.

14. A nonvolatile semiconductor memory system comprising:
a plurality of the nonvolatile semiconductor memory devices according to claim 1;
a power source connector configured to receive from the outside a voltage input to the second power source input of the nonvolatile semiconductor memory devices;
a voltage step-down part configured to step down a voltage input to the second power source input and to generate a voltage to be input to the first power source input of the nonvolatile semiconductor memory devices; and
a controller configured to operate by receiving the second power source input and to control the nonvolatile semiconductor memory devices.

* * * * *